US006979581B2

(12) United States Patent  (10) Patent No.: US 6,979,581 B2
Sai  (45) Date of Patent: Dec. 27, 2005

(54) METHOD OF MANUFACTURING SEMICONDUCTOR LIGHT EMITTING DEVICE AND OXIDATION FURNACE

(75) Inventor: Hironobu Sai, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 104 days.

(21) Appl. No.: 10/318,121

(22) Filed: Dec. 13, 2002

(65) Prior Publication Data

US 2003/0139060 A1   Jul. 24, 2003

(30) Foreign Application Priority Data

Dec. 13, 2001 (JP) .............................. 2001-379722

(51) Int. Cl.[7] .............................................. H01L 21/20
(52) U.S. Cl. ..................... 438/22; 438/483; 438/46
(58) Field of Search ................... 438/22–47, 479–509

(56) References Cited

U.S. PATENT DOCUMENTS

| | | | | |
|---|---|---|---|---|
| 5,327,448 A | * | 7/1994 | Holonyak et al. | ............ 372/94 |
| 5,493,577 A | * | 2/1996 | Choquette et al. | ............ 372/46 |
| 5,550,081 A | * | 8/1996 | Holonyak et al. | ............ 438/33 |
| 5,594,751 A | * | 1/1997 | Scott | ............ 372/24 |
| 6,555,407 B1 | * | 4/2003 | Chitica et al. | ............ 438/24 |
| 6,714,572 B2 | * | 3/2004 | Coldren et al. | ............ 372/46 |
| 2001/0004114 A1 | * | 6/2001 | Yuri | ............ 257/94 |
| 2002/0127758 A1 | * | 9/2002 | Dagenais et al. | ............ 438/46 |
| 2003/0189963 A1 | * | 10/2003 | Deppe et al. | ............ 372/96 |

OTHER PUBLICATIONS

Feld et al, "In situ Optical Monitoring of AlAs Wet Oxiadation Using a Novel Low-Temperature Low-pressure Stream Furnace Design", IEEE Photonics Technology Letters vo. 10, No. 2, Feb. 1998, pp 197-199.*
Sakmoto et al, Fabrication Control during AlAs oxidationof the VCSELs via Optical probing Technique of AlAsLateral Oxiadation(OPTALO) Proceeding SPIE vol. 4649,(2002) pp 211-217.*

* cited by examiner

Primary Examiner—Savitri Mulpuri
(74) Attorney, Agent, or Firm—Rabin & Berdo, P.C.

(57) ABSTRACT

A sample stand is set in a chamber provided with an observation window on its upper surface and a heater for heating a sample is provided in the vicinity of the sample stand. Then, a microscope, a camera and a television monitor are connected and mounted outside the observation window of the chamber. The microscope is mounted such that a specific layer of the sample is focused on and can be observed. According to a manufacturing method of the preset invention, oxidation treatment is performed in such equipment while an oxidation process of the specific layer (semiconductor layer for selective oxidation) of the sample is observed. As a result, the amount of oxidation of the semiconductor layer for selective oxidation can be strictly controlled, a semiconductor light emitting device which restricts a current into a certain region can be obtained with high yield ratio, and there is obtained an oxidation furnace which can precisely control the amount of oxidation of the semiconductor layer for selective oxidation.

16 Claims, 3 Drawing Sheets

METHOD OF MANUFACTURING SEMICONDUCTOR LIGHT EMITTING DEVICE AND OXIDATION FURNACE

FIELD OF THE INVENTION

The present invention relates to a method of manufacturing a semiconductor light emitting device such as a surface light emitting laser (vertical cavity surface emitting laser; VCSEL) or a stripe type laser which limits a current in a certain region and an oxidation furnace used therewith. It relates more particularly to a method of manufacturing a semiconductor light emitting device and an oxidation furnace used therewith, in which when a semiconductor layer for selective oxidation is oxidized from its outer periphery to form a current injection region, the size of the current injection region can be precisely controlled by observing it on the moment.

BACKGROUND OF THE INVENTION

For a conventional surface emitting laser, a structure shown in FIG. 6 is well known. More specifically, a lower multilayer reflection film 42 which comprises laminated semiconductor layers having different refractive indexes, called DBR (distributed Brag reflector) and reflects light with a specific frequency band is formed on a semiconductor substrate 41 made of GaAs, for example. Then, a light emitting layer forming portion 46 comprising a lower spacer layer, an active layer and an upper spacer layer (not shown) and an upper multilayer reflection film 48 comprising DBR are formed thereon and then an insulating region 47 is formed by implanting ion such as proton to a part other than a current injection region serving as the light emitting region.

Upper and lower electrodes (not shown) are provided on the upper surface of the upper DBR and lower surface of the semiconductor substrate and laser beam is output from a small outlet provided in the upper electrode (not shown) through the upper multilayer reflection film 48 whose reflectance is made a little smaller.

In addition, recently, in stead of insulation by ion implantation of proton or the like, there is proposed a method of forming the current limit layer comprising a step of intervening a semiconductor layer for selective oxidization made of AlAs, for example which is likely to be oxidized by vapor or the like between the light emitting layer forming portion 46 and the upper multilayer reflection film 48, a step of etching its peripheral part such that the current injection region and a certain region of its outer periphery may be left in mesa-shape, a step of selectively oxidizing it from its outer exposed part under a vapor atmosphere and a step of stopping the oxidation treatment so as not to oxidize the current injection region.

According to the conventional method in which a predetermined range of current injection region is formed in the center by stopping the oxidation treatment, a test sample is previously oxidized on a certain condition, that sample is taken out of the oxidation furnace, an oxidized distance is measured and then, the oxidation treatment is performed for a certain period based on that data to form the predetermined current injection region.

As described above, if the semiconductor layer for selective oxidation which is likely to be oxidized is provided to form the semiconductor laminated part and then the current limit layer is formed such that the desired size of current injection region may be left by oxidizing the semiconductor layer for selective oxidation from its periphery, a current can be injected into a narrow region without a different kind of step in which the semiconductor substrate is taken out of an equipment to provide a mask on the semiconductor layer in the course of lamination of the semiconductor layers and etched, or a complicated step in which the semiconductor layer around the current injection region is insulated by ion implantation using a mask after the semiconductor laminated part is formed.

As described above, the method of forming the current limit layer by performing selective oxidation treatment after the semiconductor laminated part is formed using the semiconductor layer for selective oxidation is simple and preferable for the manufacturing steps. However, even if the oxidation condition is set using the test sample, oxidation speed is likely to be changed by variation in temperature of the substrate put in the oxidation furnace, change in partial pressure or temperature of vapor, or variation in thickness of the current limit layer. Thus, since it is necessary to perform the condition setting using the sample several times, it takes time, and yet large variation still exists in practice.

Especially, in a case of the surface emitting laser, a width of the current injection region is about 8 $\mu$m square in a multimode oscillation as is used conventionally and its variation is about ±1 $\mu$m to 2 $\mu$m, which does not matter. However, in a single-mode oscillation to be required from here on, the current injection region needs to be 3.5 $\mu$m square or less depending on its wavelength but if it becomes too small, the output is extremely decreased and therefore its variation must be under 0.5 $\mu$m. Thus, in the conventional method of performing oxidation treatment by setting a certain condition, the yield ratio is decreased, which is not practical.

Furthermore, as a result of the earnest investigation by the inventor of the present invention, it was found that oxidation time is in proportion to oxidation distance at the beginning of the oxidation but the proportionality relation is destroyed when the width of the region not to be oxidized and to be left as the current injection region is 5 $\mu$m or less, that is, the oxidation is more progressed for the same period, so that in a case where the small current injection region for the single-mode oscillation is to be formed, the oxidation treatment performed by previously setting the condition cannot be precisely controlled.

SUMMARY OF THE INVENTION

The present invention was made in view of the above situations and it is an object of the present invention to provide a method of manufacturing a semiconductor light emitting device, in which an amount of oxidation of a semiconductor layer for selective oxidation is precisely controlled and a device which restricts a current in a certain region, such as a surface emitting laser, a stripe type semiconductor laser or light emitting diode (LED) can be manufactured with high performance.

It is an another object of the present invention to provide an oxidation furnace in which an amount of oxidation of the semiconductor layer for selective oxidation can be precisely controlled.

The method of manufacturing a semiconductor light emitting device of the present invention comprises the steps of; (a) forming a semiconductor laminated part comprising a light emitting layer forming portion and a semiconductor layer for selective oxidation for forming a current injection region on a substrate, (b) etching away a part of the semiconductor laminated part such that the current injection region and its peripheral region would be left in mesa-shape, (c) forming a predetermined range of current injection region by oxidizing the semiconductor layer for selective oxidation etched in mesa-shape from its periphery toward its center, while observing the semiconductor layer for selective oxidation from a surface side of the semiconductor laminated part, and (d) forming electrodes for electrical connection on both sides of the semiconductor laminated part.

The semiconductor layer for selective oxidation here means a layer which is laminated sequentially with other semiconductor layers and only oxidized over a larger region by the oxidation treatment as compared with the other semiconductor layers to form a desired range of oxidized region.

According to the method, since the oxidation treatment is performed while the progress of the oxidation of the semiconductor layer for selective oxidation is directly observed by the microscope mounted outside the chamber, that is, the oxidation treatment is performed while observing on the moment, even if variation causing an influence on oxidation conditions such as variation in substrate temperature, variation in vapor temperature or vapor concentration to carrier gas occurred, the oxidation treatment can be always performed by a constant amount of oxidation. Therefore, there can be provided a semiconductor light emitting device with stable quality and high yield ratio.

In addition, when the oxidation condition is observed directly by the microscope during the oxidation treatment, it is necessary to make the distance shorter so as to focus on the semiconductor layer for selective oxidation, because the distance between the microscope provided outside the furnace and the sample is too large in a conventional oxidation furnace to observe the sample directly. In addition, it is necessary to stabilize and make uniform an amount of supply (vapor concentration) and a temperature of the oxidation source (vapor) in the vicinity of the semiconductor laminated part which is likely to be variable when the distance is narrowed as will be described hereinafter.

The oxidation furnace of the present invention comprises: a chamber provided with an observation window on its upper surface; a sample stand provided in the chamber; a heater provided in the vicinity of the sample stand to heat a sample provided on the sample stand; a vapor source supplying a vapor for oxidation to the vicinity of the sample; a microscope mounted outside the chamber for observing the sample through the observation window, in which the sample stand is provided such that a specific layer of the sample can be focused on and observed by the microscope by adjusting a distance between the sample surface and the observation window and oxidation treatment is performed while oxidation process of the specific layer of the sample is observed.

The sample here means one in which the semiconductor laminated part is formed on a substrate of wafer in a case where the current limit layer is formed on the semiconductor light emitting device, for example, and the sample to be observed by the microscope is a specific semiconductor layer of one or several chips among chips formed on the wafer.

The above-described observation window may have a structure in which a through hole provided in the chamber is closed by a thin transparent plate. By this structure the precision of observation is considerably improved and the change in oxidation can be observed through the thin window. Whereas the image observed by the microscope could be blurred and it is difficult to observe the accurate oxidation condition in a case where a thick glass is used for the window.

In addition, since the thin transparent plate is provided on both inner and outer surfaces of the chamber, it is helpful to make the vapor temperature uniform in the vicinity of the sample.

Furthermore, the amount of supply (vapor concentration) and temperature of the oxidation source in the vicinity of the semiconductor laminated part, which is likely to be variable by narrowing the distance between the sample and the observation window can be made stable and uniform by providing means of making uniform the temperature and/or concentration of the vapor in the vicinity of the sample. By this means, the vapor supplied is heated up to the oxidation temperature of the sample or higher to be introduced into the chamber, a concave part is formed in a part of the sample stand on which the sample is put or a convex part is formed around the sample. Thus, the temperature or concentration of the vapor in the vicinity of the sample can be further made uniform.

In addition, although the vapor is usually introduced together with carrier gas such as nitrogen, if the ratio of amount of the carrier gas is made considerably smaller or the vapor is only introduced, it is not likely to be influenced by the carrier gas which is low in temperature and even if the position of the sample stand is provided closer to one inner wall in the chamber, it is not likely to be influenced by the introduction gas.

Thus, the sample stand can be set so as to be close to one part of the inner wall of the chamber, so that the condition of the sample in the chamber can be directly observed by the microscope mounted outside the chamber and the oxidation treatment is performed while the oxidation process is observed on the moment.

DETAILED DESCRIPTION

Then, a description will be made of an oxidation furnace according to the present invention and a method of manufacturing a semiconductor light emitting device using it.

Figure 1:
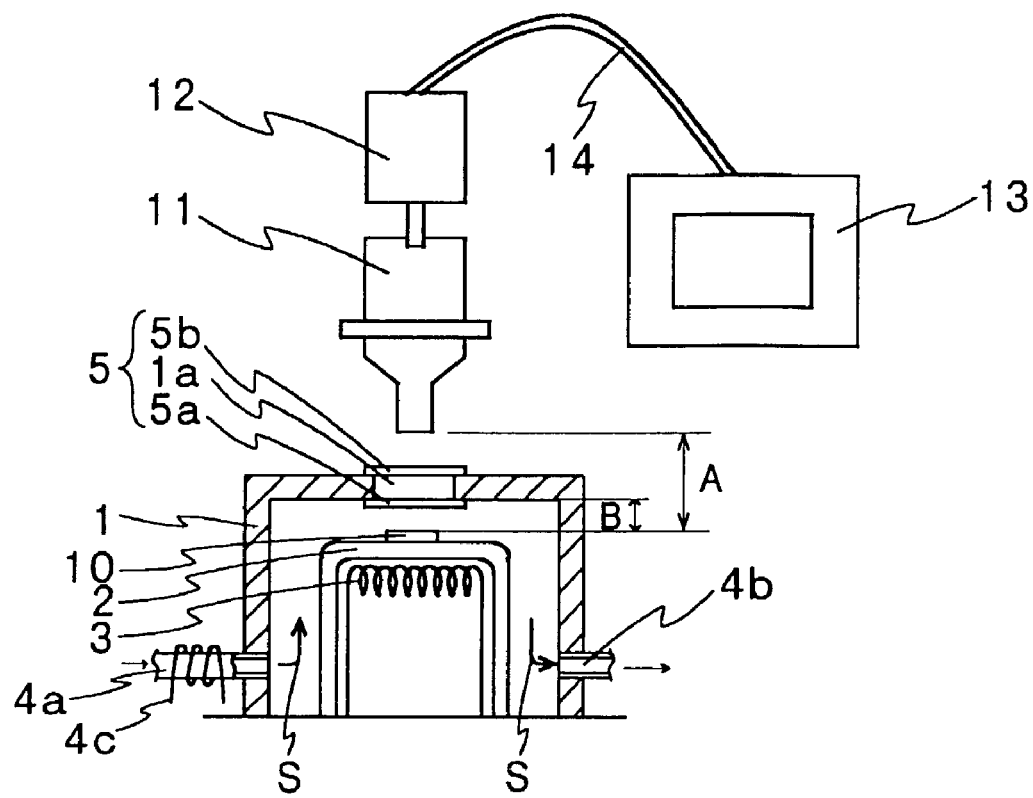
FIG. 1 is a schematic view showing an oxidation furnace of the present invention.

According to an oxidation furnace of the present invention, as its schematic view is shown in FIG. 1, a sample stand 2 is provided in a chamber 1 comprising an observation window 5 on its upper surface, and a heater 3 for heating a sample 10 is provided in the vicinity of the sample stand 2. A vapor supply pipe 4a of a vapor source for supplying vapor for oxidization to the vicinity of the sample 10 and an exhaust pipe 4b are mounted onto the side wall of the chamber 1. According to the example shown in FIG. 1, the observation window 5 provided on the upper portion of the chamber 1 includes a through hole 1a provided at the chamber 1 and thin glass plates 5a and 5b of about 0.1 mm to 0.2 mm provided on the inner surface and outer surface of the chamber 1, respectively so as to cover the through hole 1a, which are attached together.

A microscope 11 is provided over the observation window 5 of the chamber 1. The microscope 11 is mounted so as to be in very close proximity to the chamber 1 so as to be able to observe the sample 10 through the observation window 5. In addition, a camera 12 such as a vidicon camera or a CCD camera is directly connected to the microscope 11 and a television monitor 13 is connected to the camera 12 through a cable 14. According to the present invention, a distance B between the sample 10 surface and the observation window 5 is 10 mm or less such that a specific layer of the sample 10 can be focused on and observed by the microscope 11 and oxidation treatment is performed while observing an oxidation process of the specific layer (a semiconductor layer for selective oxidation, for example) of the sample 10.

The chamber 1 has a cylindrical shape or the like having a ceiling (upper wall) made of quartz glass or stainless. On the side wall of the chamber 1, the vapor supply pipe (vapor source) 4a for introducing vapor gas as an oxidation source and the exhaust pipe 4b are provided and on the upper surface (upper wall), the observation window 5 is provided. According to the example shown in FIG. 1, a heater 4c is provided at the vapor supply pipe 4a as means of making uniform the vapor temperature in the vicinity of the sample such that the vapor temperature to be introduced can be kept at about 400° C. to 500° C. which is about the same temperature of the sample 10. Thus, the following problem is solved, that is, since the distance between the surface of the sample 10 and the observation window 5 is very close as described above, the temperature of the sample 10 is likely to be lowered and it is difficult to perform uniform oxidation. Alternatively, the vapor may be introduced from the bottom side instead of from the side wall of the chamber 1 or vapor may be directly generated in the chamber 1.

The observation window 5 is provided for observation, by the microscope 11 described later, of a specific semiconductor layer (a semiconductor layer for selective oxidation, for example) of the sample consisting of wafer-shaped semiconductor laminated layers, in which the through hole 1a is formed at the upper wall of the chamber 1 and transparent glass plates 5a and 5b (light transmitting plate) made of thin quartz glass which is about 0.1 mm to 0.2 mm in thickness are attached on the inner and outer walls of the chamber 1 so as to cover the through hole 1a. It is necessary to form the observation window 5 in this way even when the chamber 1 is made of a transparent material such as quartz glass.

More specifically, the inventor of the present invention tried to observe the specific semiconductor layer of the sample from the outside of the chamber 1 directly by the microscope 11 in a case where the chamber 1 is made of quartz glass, but it was found that since the chamber was several mm (millimeter) or more in thickness according to the necessity of mechanical strength, precision of 1 μm or less which was necessary for oxidation control could not be obtained because of defocus caused by the thickness and the thickness of the observation window has to be about 0.1 mm to 0.2 mm or less in order to observe it.

In addition, since it is necessary to uniformly keep the temperature of the sample 10 provided close to the upper wall of the chamber 1 in spite of the temperature difference between the high temperature (400° C. to 500° C.) in the chamber 1 and the room temperature outside the chamber 1, if the chamber is a double structure (that is, transparent glass plates 5a and 5b), its observation and uniformly oxidized distribution of the inside chamber can be successfully obtained. The temperature of the sample can be uniformly kept by providing the above-described means of making the vapor temperature uniform even if one of the transparent glass plates 5a and 5b is provided on either side.

The sample stand 2 is provided in the chamber 1. The sample stand 2 is made of Cu, SiC, $Al_2O_3$, PBN or the like on which the sample 10 comprising a wafer in which semiconductor laminated parts are grown, for example is put and heated up to about 400° C. to 500° C., for example. The heater 3 is provided under the sample stand 2. According to the present invention, an interval between the sample stand 2 and the ceiling of the chamber 1, that is, the distance B between the surface of the sample 10 put on the sample stand and the inner surface of the upper wall of the chamber 1 is as short as about 10 mm or less as compared to about 20 cm conventionally. This is because it is necessary to focus on the specific semiconductor layer in order to observe the existence of the oxidation in the specific semiconductor layer of the semiconductor laminated parts by the microscope directly and a distance (almost focal length) A between the end of the microscope 11 and the sample surface is about 0.6 cm to 1.5 cm. Meanwhile, as the distance between the sample surface and the inner wall of the chamber 1 is decreased, the distribution of vapor is not uniform especially in the vicinity of the sample in the chamber 1, so that the oxidation treatment could not be uniformly performed.

The inventor of the present invention devoted himself into investigations so as to solve the above problems, with the result that it was found that the temperature was lowered at a part close to the inner wall of the chamber 1 because of an influence of the temperature outside the chamber 1 as well as the vapor flowing along the inner wall of the chamber 1, which could influence the uniformity of the temperature especially at the outer periphery of the sample, and if the distance between the chamber inner wall and the sample 10 was large, since the temperature of the vapor was raised while the vapor came down to the sample 10 position from the inner wall, but if the distance was small, the temperature distribution of the vapor was not uniform.

Then, as shown in FIG. 1 and described above, the vapor is directly heated up to about 400° C. to 500° C. as high as the sample temperature when it is introduced into the chamber 1 and sent to the sample, so that the above problem is solved and the observation and the uniformly oxidized distribution of the inside chamber can be successfully obtained as described above.

Figure 4A:
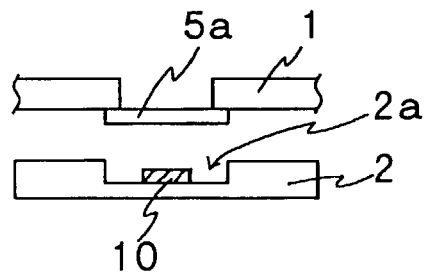
FIGS. 4A to 4C are partially sectional views showing examples of means of making uniform vapor temperature and concentration.
Figure 4B:
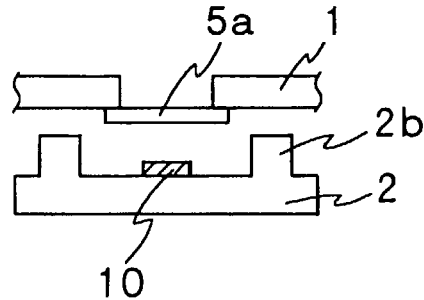
Figure 4C:
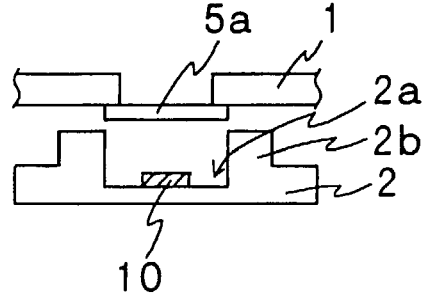

In this case, in addition to heating up the vapor temperature at the time of introduction, as enlarged sectional view of the sample 10 and the observation window 5 are shown in FIGS. 4A to 4C, when a concave part 2a is formed at a part of the sample stand 2 on which the sample 10 is put, the flow of the introduced vapor would not be applied to the sample 10 directly, so that the temperature distribution over the sample 10 and the vapor concentration around the sample 10 is likely to be made uniform.

Although a simple structure in which only the concave part 2a is formed in the sample stand 2 is shown FIG. 4A, this structure contributes to allow the vapor temperature near the sample to be uniform because as shown by an arrow S in FIG. 1, the vapor flows up along the inner wall of the chamber 1 and then flows in the lateral direction at the top, the vapor flow would not be applied to the sample 10 directly.

In addition, as shown in FIG. 4B, the same effect can be obtained by providing a convex part 2b on the stand 2 near the sample 10. In addition, as shown in FIG. 4C, if the concave part 2a and the convex part 2b are both formed, the uniformity of the temperature of the sample 10 and vapor concentration around it can be further improved. More specifically, there is provided the means of making uniform the temperature and/or concentration of the vapor, in which the introduced vapor is heated up or the configuration of the sample stand 2 is changed.

The microscope 11 is mounted over the observation window 5 outside the chamber 1 such that the sample 10 in the chamber 1 can be observed. The microscope 11 is mounted such that the specific semiconductor layer of the sample 10 could be at a focal distance A of the microscope 11. Since the sample stand 2 is provided on the upper wall side of the chamber 1 as described above, the microscope 11 can be mounted such that the sample 10 could be at the focal distance by mounting its end so as to be close to the observation window 5.

Conventionally, as described above, since the sample stand 2 was provided at a lower part in the chamber 1 in order to uniformize the vapor in the chamber, the sample could not be directly observed by the microscope. Although it was attempted that the sample 10 was taken out of the chamber 1 and its oxidation progress under a constant condition was observed or it was observed by inserting an infrared fiber into the chamber 1, the oxidation condition could not be observed precisely in either case. According to the present invention, however, since the oxidation treatment can be performed while the oxidation condition of the sample is being observed by the microscope 11, the oxidation treatment can be precisely performed.

The microscope 11 is illuminated by light from a light source such as a normal tungsten lamp or xenon lamp to observe the image by reflected light. Since the surface of the semiconductor layer for selective oxidation to be observed is flat and uniform and likely to transmit light, it is preferable to use a filter which removes light having a wavelength shorter than that of visible light and having high intensity which causes diffused reflection to generate noise. In addition, for a surface emitting laser, since a multilayer reflection film called DBR is provided on the surface of the semiconductor laminated part and most of emitting light is reflected and confined in a resonator, it is preferable to cut the light having wavelength of emitting light as much as possible so as to avoid an influence caused by reflection in DBR.

Figure 3:
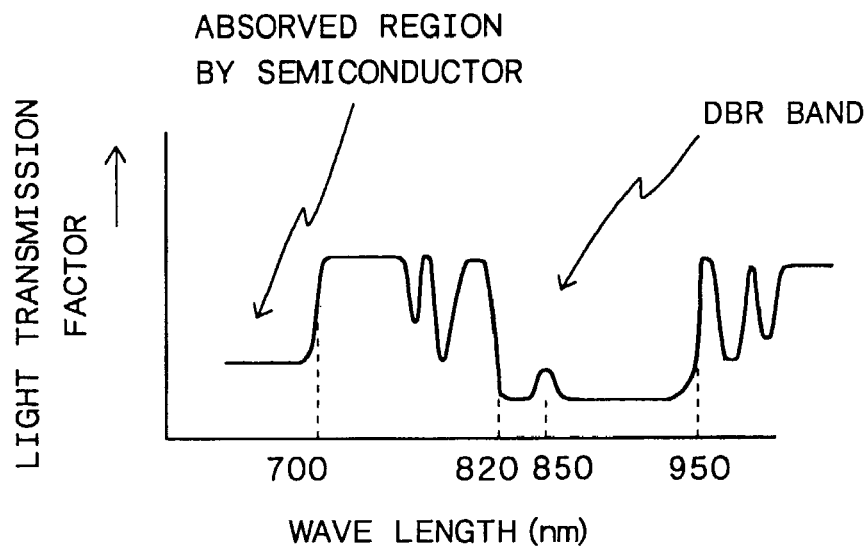
FIG. 3 is a graph showing an example of light transmission factor to wavelength of DBR shown in FIG. 5.

For example, transmission factor of the DBR of the surface emitting laser to the wavelength has a band characteristic shown in FIG. 3 (the light of wavelength of 700 nm or less is transmitted in DBR but absorbed by the semiconductor layer so that the transmission factor is decreased), the light of 820 nm to 950 nm wavelength band preferably has been cut. However, even in this wavelength band, the light of 850 nm is transmitted a little and can be used for measurement in relation of the resonator.

However, since the microscope focuses on the semiconductor layer for selective oxidation other than DBR, even if the light with wavelength which is reflected by DBR has not been removed, the process of the oxidation of the semiconductor layer for selective oxidation can be observed. In addition, even when the wavelength of the light to be used is infrared light other than the visible light, its intensity can be recognized by a camera to be described later. However, the light with a short wavelength is preferable because it is sensitive.

The camera 12 such as vidicon camera or CCD camera and the television monitor 13 are connected to the microscope 11 through the cable 14 and the image of the specific semiconductor layer of the sample 10 focused by the microscope 11 can be seen in the television monitor 13 as a contrasting image by the reflected light of infrared ray of the light source. Thus, the oxidation treatment is performed while it is observed by the television monitor 13. In addition, according to a case where a semiconductor device such as semiconductor laser is manufactured, semiconductor laminated part is grown, in which several hundreds of chips are provided on a wafer of the semiconductor substrate, every chip is formed to be mesa-shape and the wafer is oxidized.

In this case, while the oxidation treatment is performed while one or several chips are observed as a sample, if there is the possibility that the vapor distribution or the temperature distribution in the chamber 1 is not uniform, the oxidation condition of the chip provided at the end of the sample 10 is checked by sifting the microscope in a transverse direction. When there is some variation, it can be uniformized by adjusting the intensity of the heater 3 in part.

Figure 2A:
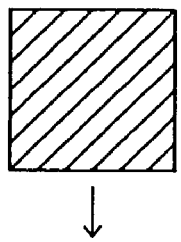
FIGS. 2A to 2C are views showing variations of an image observed on the moment in the oxidation furnace of the present invention.
Figure 2B:
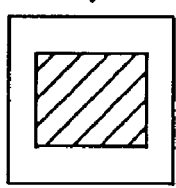
Figure 2C:
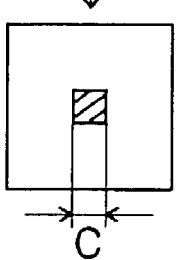

Examples of the change in image seen in the television monitor 13 are shown in FIGS. 2A to 2C. More specifically, FIG. 2A is an image of the semiconductor layer for selective oxidation before the oxidation treatment. In this sate, there is a small difference in refractive index between the semiconductor layer for selective oxidation made of AlAs, for example and the adjacent semiconductor layer and the reflection of light from the microscope is small, so that the whole image from the microscope looks dark.

Then, when the oxidation is started, the semiconductor layer for selective oxidation made of AlAs which is especially likely to be oxidized by vapor is oxidized from its outer periphery by the introduced vapor and $Al_2O_3$ is formed. The refractive index of $Al_2O_3$ is about 1 to 2, which is very different from the refractive index of about 3 to 3.5 of the semiconductor layer so that its reflectance is very different from that of the part which is not oxidized and difference in contrast is generated. As a result, the reflected light of the oxidized part is strong, as shown in FIG. 2B, the outer periphery is white and the inner part which is not oxidized is dark.

As the oxidation further proceeds, the oxidation region proceeds to the center of the AlAs layer, as shown in FIG. 2C, a desired dimension C is left as a dark part. The white outer periphery part shown in FIG. 2C is made of $Al_2O_3$ through oxidation and it is an insulating layer in which a current cannot be injected. Therefore, when the oxidation treatment is performed while the dimension C is measured, there is provided a current limit layer in which a current is narrowed at only a current injection region at the desired size (dark part at the center).

Figure 5:
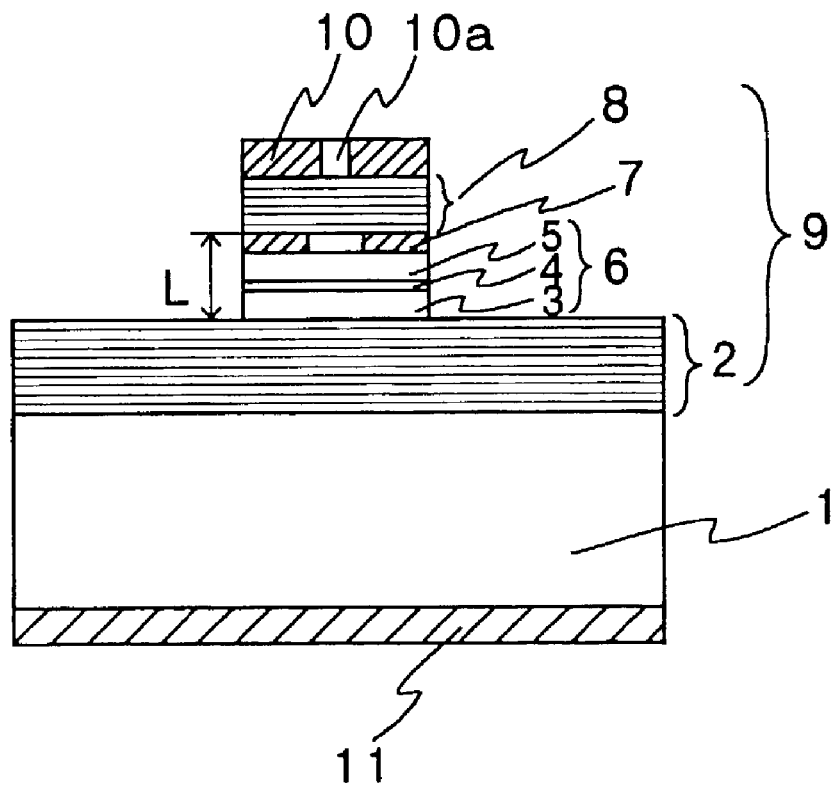
FIG. 5 is a sectional view showing one example of a surface emitting semiconductor laser manufactured by a method of manufacturing a semiconductor light emitting device of the present invention.
Figure 6:
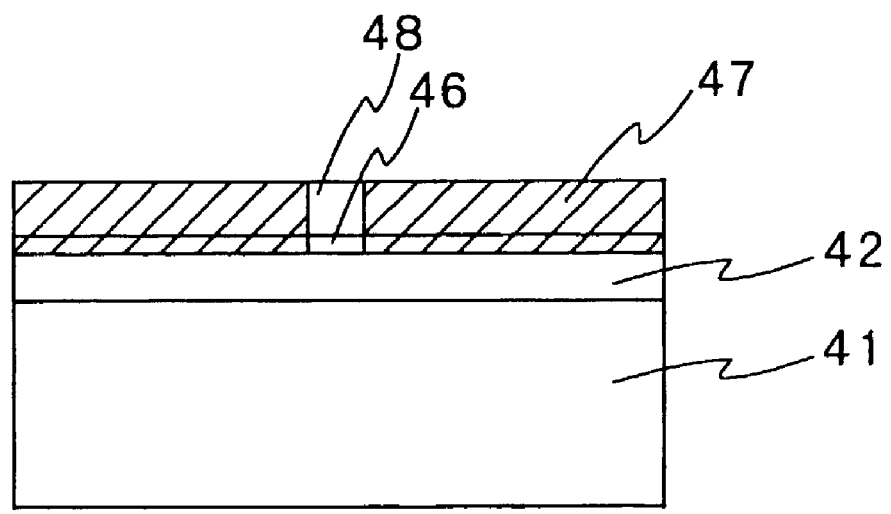
FIG. 6 is a sectional view showing one example of a conventional surface emitting laser.

Then, the method of manufacturing the semiconductor light emitting device of the present invention will be described in reference to a surface emitting type semiconductor laser whose sectional view is shown in FIG. 5.

For example, an n-type GaAs substrate 1 is put in an MOCVD (metal organic chemical vapor deposition) apparatus, and for reaction gas, triethylgallium (TEG) or trimethylgallium (TMG), arsine ($AsH_3$), trimethylaluminum (TMA), $H_2Se$ for n-type dopant, dimethylzinc (DMZn) or the like as p-type dopant when p-type layer is deposited are introduced, respectively. As shown in FIG. 5, about thirty three pairs of n-type $Al_{0.9}Ga_{0.1}As$ and $Al_{0.2}Ga_{0.8}As$ each of which is λ/4 in thickness are alternately laminated to grow the lower part multilayer reflection film (DBR) 2.

Then, an n-type spacer layer 3 made of $Al_{0.6}Ga_{0.4}As$, for example is formed to be about 0.07 μm to 0.09 μm in thickness, an active layer 4 of multiple quantum well structure (MQW) in which a non-doped well layer made of $Al_{0.3}Ga_{0.7}As$ and a barrier layer made of $Al_{0.6}Ga_{0.4}As$ are laminated by five, respectively is grown so as to be about 0.05 μm to 0.07 μm in thickness, and a p-type spacer layer 5 is grown so as to be about 0.07 μm to 0.09 μm in thickness, with the result that a light emitting layer forming portion 6 is formed. Then, p-type semiconductor layer for selective oxidation 7 made of AlAs is grown thereon so as to be about 0.02 μm to 0.05 μm in thickness. Since the thickness of the light emitting layer forming portion 6 and the semiconductor layer for selective oxidation 7 is the length of the resonator, the thickness of each layer is decided such that total thickness would be about wavelength of the emitting light. Then, about twenty three pairs of $Al_{0.9}Ga_{0.1}As$ and $Al_{0.2}Ga_{0.8}As$ are alternately laminated to form an upper multilayer reflection film (DBR) 8. The semiconductor laminated part 9 ranges from the lower multilayer reflection film 2 to the upper multilayer reflection film 8.

Then, $SiO_2$ or a resist film is formed over the surface of the semiconductor laminated part 9 as a mask and the mask (not shown) is formed by patterning such that the current injection region in the center and its outer periphery of width of about 10 μm to 50 μm are left. Then, by wet etching or dry etching such as RIE or ICP, the exposed semiconductor laminated part 9 is etched away until the lower multilayer reflection film 2 is exposed, and as shown in FIG. 5, the current injection region and its periphery is formed so as to be mesa-shape (about 30 μm×30 μm).

In addition, although only one chip is shown in FIG. 5, many chips are formed in a big substrate 1 actually and chips of the mesa-shape shown in FIG. 5 are formed on the substrate 1 in matrix-shape.

Then, the wafer on which many mesa-shaped parts of the semiconductor laminated part are formed is put on the sample stand of the oxidation furnace shown in FIG. 1 and the microscope 11 is set so as to focus on the semiconductor layer for selective oxidation 7. Then, the substrate temperature is heated up to about 400° C. to 500° C. while vapor is introduced and as described above, oxidation proceeds from the outer periphery of the semiconductor layer for selective oxidation 7 to its inside.

In this case, although the light emitting layer forming portion 6 and the upper multilayer reflection film 8 are also oxidized by vapor, since in the light emitting layer forming portion, the ratio of Al of AlGaAS is small such as about 0.6, its oxidation speed is very slow and its outer periphery is oxidized a little, which is no problem for the laser and in the upper multilayer reflection film 8, the layer in which Al is 0.9 is relatively likely to be oxidized but it is 1/10 as compared to the oxidation of the semiconductor layer for selective oxidation 7 in which Al is almost 100%, which is also no problem. Therefore, while the oxidation process of the semiconductor layer for selective oxidation 7 is observed by the microscope, if the oxidation reached the outer periphery of a predetermined region, the oxidation treatment is stopped to form the current limit layer 7 in which the current injection region is precisely formed.

Then, an insulating film (not shown) such as polyimide is filled in the concave part formed by mesa-shaped etching and metal such as Au/Ti is provided by deposition on the upper surface and then patterned, and metal such as Au/Au—Ge—Ni is provided by deposition on the lower surface of the semiconductor substrate 1 to form an upper electrode 10 and a lower electrode 11. In addition, the upper electrode 10 is patterned such that an outlet 10a of about several μm square is provided in the current injection region so as to be in the center thereof. Then, dicing is performed to form chips and the surface emitting type semiconductor laser having the structure shown in FIG. 5 is provided.

The lower multilayer reflection film 2 and the upper multilayer reflection film 8 are formed as DBR (distributed Brag reflection) using Brag reflection in which for example, $Al_{0.9}Ga_{0.1}As$ and $Al_{0.2}Ga_{0.8}As$ which are different in refractive index and each of which is λ/4 in thickness (k is a wavelength of emitting light in the active layer) are alternately laminated. According to the multilayer reflection films 2 and 8, if the difference in refractive index between two layers is large, high reflectance is provided by laminating the small number of layers and if it is small, high reflectance is provided by laminating the large number of layers. As described above, the lower multilayer reflection film 2 is formed by laminating, for example, thirty three pairs of layers such that its reflectance would be about 99.999% or more and the upper multilayer reflection film 8 is formed by laminating, for example, about twenty three pairs of layers such that its reflectance would be about 98 to 99% which is lower than that of the lower multilayer reflection film 2, so that a part of emitting light can be exited.

The light emitting layer forming portion 6 is formed such that lower and upper spacer layers 3 and 5 made of AlGaAs based compound semiconductor such as $Al_{0.6}Ga_{0.4}As$ whose bandgap are wider than that of the active layer 4 sandwich the active layer 4 to confine carriers. The active layer 4 is made of a bandgap material so as to have a desired light emitting wavelength and it is a bulk structure or simple or multiple quantum well structure (MQW). Similar to the semiconductor laser of the stripe structure, a lower threshold value is obtained in the multiple quantum well structure, which is preferable. In a case of the multiple quantum well structure, for example, a well layer is formed of $Al_{0.3}Ga_{0.7}As$ in thickness of about 7 nm and a barrier layer is formed of $Al_{0.6}Ga_{0.4}As$ in thickness of about 10 nm and they are alternately laminated until about three of the well layers are laminated.

Although the semiconductor layer for selective oxidation 7 was made of AlAs in the above example, it may be made of a material which is especially likely to be oxidized as compared with the other semiconductor layer. In AlGaAs based compound, as a mix crystal ratio of Al is increased, that is, it comes close to 100%, it is likely to be oxidized. More specifically, if it is 100%, its oxidation speed is about ten times as high as that in a case of 90%. Therefore, the material including Ga or In to some extent in relation to composition of other semiconductor layers can be used, so that III-V group compound in which Al is 10 at % or less, more preferably Al is 5 at % or less can be used.

Since the light emitting layer forming portion 6 and the semiconductor layer for selective oxidation 7 disposed between the upper and lower multilayer reflection films 2 and 8 are laminated such that their total thickness serves as the resonator, the thickness becomes an integral multiple of the light emitting wavelength, for example, the same length as the light emitting wavelength.

According to the manufacturing method of the present invention, since the oxidation treatment and measurement of the width of the current injection region not to be oxidized are performed at the same time, when the furnace is started to operate or when defection of a product is found, it is not necessary to set previously the oxidation condition by examining the furnace condition every at that time. The oxidation process can be completed for ten minutes at a time, as compared to the fact that conventionally, it took six hours to set the oxidation condition. In addition, since the oxidation treatment is performed while measurement is performed, the width of the current injection region which is not to be oxidized can be left with precision as high as 0.5 μm.

More specifically, for the conventional surface emitting laser in which the current injection region was formed by oxidizing AlAs, since the oxidation region could not be controlled by observation on the moment, a test sample was oxidized first and then its oxidation condition was examined to set the oxidation condition. Then, the oxidation treatment was performed to a product actually. Therefore, it took one hour or more to oxidize the test sample one time and examine the result thereof. In addition, the condition was not set until 4 to 5 times of oxidation of the test sample were performed sequentially, so that it took a half day to set the oxidation condition, and yet the condition of the oxidation furnace fluctuated at each operation. More specifically, in a case where the current injection region with width of about 8 μm was formed, there was variation of about 1 μm to 2 μm. According to the present invention, however, the oxidation treatment can be performed for very short time and its precision is highly improved.

Although the above example is in the case of the surface emitting laser, a current limit layer of a stripe type semiconductor laser in which the current blocking layer is embedded can be also oxidized with high precision, so that a stripe which is several μm in width can be precisely formed. In this case, after the wafer is diced to bar-shape, it is oxidized from the side surface along the stripe and then cleaved to the chip, so that the oxidation treatment is not performed to its cleavage plane. Alternatively, as described above, after the side surface along the stripe is etched away and bar-shaped mesa is formed, the oxidation treatment may be performed. In addition, for the LED, in a case where light emits inside the chip without injecting a current around the chip, the periphery of the chip is etched away to be mesa-shape and then oxidized, so that an insulating layer is formed by oxidation around the chip.

According to the method of manufacturing the semiconductor light emitting device of the present invention, when the current blocking layer is formed by oxidization to leave the current injection region of the semiconductor layer for selective oxidation, since the oxidation condition can be observed on the moment, the current injection region can be formed with precision as high as that of the structure including an etching step in process of laminating layers of the semiconductor. In addition, since the etching step is not necessary in process of laminating layers in this case, the manufacturing process is very simple and crystalline characteristic of the semiconductor layer is very high, so that there can be provided the semiconductor light emitting device with high performance. Furthermore, in the case of the surface emitting semiconductor, since the current injection region can be controlled with high precision, while the region is made smaller and single-mode oscillation is performed, a desired output can be obtained, so that it can be effectively used for optical communication or optical pickup.

Furthermore, according to the oxidation furnace of the present invention, since the distance between the sample stand and the upper surface of the chamber is set such that the sample set on the sample stand can be directly observed by the microscope, the oxidation treatment can be performed while the sample in the process is observed by the television monitor. As a result, in spite of various changes of conditions, the oxidation treatment can be performed with high precision and the current blocking layer of the semiconductor light emitting device such as the semiconductor laser or the light emitting diode can be formed by selective oxidation of the semiconductor layer for selective oxidation, with the result that the characteristic of the semiconductor light emitting device is improved and its manufacturing steps can be decreased.

Although preferred examples have been described in some detail it is to be understood that certain changes can be made by those skilled in the art without departing from the spirit and scope of the invention as defined by the appended claims.

What is claimed is:

1. A method of manufacturing a semiconductor light emitting device comprising steps of;
   (a) forming a semiconductor laminated part comprising a light emitting layer forming portion and a semiconductor layer for selective oxidation for forming a current injection region on a substrate,
   (b) etching away a part of said semiconductor laminated part such that said current injection region and its peripheral region would be left in mesa-shape,
   (c) forming a predetermined range of current injection region by oxidizing said semiconductor layer for selective oxidation etched in mesa-shape from its periphery toward its center, while observing by a microscope an oxidation condition of said semiconductor layer for selective oxidation from a surface side of said semiconductor laminated part,
   wherein the step of oxidizing said semiconductor layer for selective oxidation further comprises steps of:
   setting said substrate on which said semiconductor laminated part is grown in a chamber, and
   oxidizing said semiconductor layer for selective oxidation by supplying vapor which is stable at about 400° C. to 500° C. around said semiconductor layer for selective oxidation; and
   (d) forming electrodes for electrical connection on both sides of said semiconductor laminated part; and
   wherein a vapor supply pipe having a heater is provided on said chamber and said vapor is supplied around said semiconductor layer for selective oxidation by introducing a vapor into said chamber through said vapor supply pipe.

2. The manufacturing method according to claim 1, wherein said semiconductor layer for selective oxidation is made of AlAs.

3. The manufacturing method according to claim 1, wherein said light emitting layer forming portion has a double heterostructure in which an active layer is sandwiched by lower and upper spacer layers so as to form a surface emitting laser, a bandgap of said spacer layers being wider than that of said active layer, and wherein said semiconductor laminated part further comprises multilayer reflection films formed on upper and lower sides of said light emitting layer forming portion.

4. The manufacturing method according to claim 3, wherein said active layer is a quantum well structure.

5. A method of manufacturing a semiconductor light emitting device comprising steps of:
   (a) forming a semiconductor laminated part comprising a light emitting layer forming portion and a semiconductor layer for selective oxidation for forming a current injection region on a substrate, (b) etching away a part of said semiconductor laminated part such that said current injection region and its peripheral region would be left in mesa-shape, (c) forming a predetermined range of current injection region by oxidizing said semiconductor layer for selective oxidation etched in mesa-shape from its periphery toward its center, while observing by a microscope an oxidation condition of said semiconductor layer for selective oxidation from a surface side of said semiconductor laminated part, wherein the step of oxidizing said semiconductor layer for selective oxidation further comprises steps of:

setting said substrate on which said semiconductor laminated part is grown in a chamber, and oxidizing said semiconductor layer for selective oxidation by supplying vapor which is stable at about 400° C. to 500° C. around said semiconductor layer for selective oxidation; and (d) forming electrodes for electrical connection on both sides of said semiconductor laminated part; and wherein said vapor is supplied around said semiconductor layer for selective oxidation by generating a vapor by a heater in said chamber, wherein the stable vapor temperature is provided by said heater.

6. The manufacturing method according to claim 1, wherein said substrate is set such that a distance between a surface of said semiconductor laminated part and an inner surface of an upper wall of said chamber would be 10 mm or less and said semiconductor layer for selective oxidation is observed by a microscope from the outside of said chamber.

7. The manufacturing method according to claim 6, wherein a light is irradiated from said microscope to said semiconductor laminated part and a filter is provided in the irradiation pathway of said light, said filter removing light having wavelength shorter than that of visible light.

8. The manufacturing method according to claim 7, wherein a light transmission window is provided on said chamber in the course of the irradiation pathway of the light from said microscope and a thin transparent plate which is 0.1 mm to 0.2 mm in thickness is attached to said light transmission window.

9. The manufacturing method according to claim 8, wherein said light transmission plate is attached on both inner wall and upper wall surfaces of said chamber.

10. The manufacturing method according to claim 5, wherein said semiconductor layer for selective oxidation is made of AlAs.

11. The manufacturing method according to claim 5, wherein said light emitting layer forming portion has a double heterostructure in which art active layer is sandwiched by lower and upper spacer layers so as to form a surface emitting laser, a bandgap of said spacer layers being wider than that of said active layer, and wherein said semiconductor laminated part further comprises multilayer reflection films formed on upper and lower sides of said light emitting layer forming portion.

12. The manufacturing method according to claim 11, wherein said active layer is a quantum well structure.

13. The manufacturing method according to claim 5, wherein said substrate is set such that a distance between a surface of said semiconductor laminated part and an inner surface of an upper wall of said chamber would be 10 mm or less and said semiconductor layer for selective oxidation is observed by a microscope from the outside of said chamber.

14. The manufacturing method according to claim 13, wherein a light is irradiated from said microscope to said semiconductor laminated part and a filter is provided in the irradiation pathway of said light, said filter removing light having wavelength shorter than that of visible light.

15. The manufacturing method according to claim 14, wherein a light transmission window is provided on said chamber in the course of the irradiation pathway of the light from said microscope and a thin transparent plate which is 0.1 mm to 0.2 mm in thickness is attached to said light transmission window.

16. The manufacturing method according to claim 15, wherein said light transmission plate is attached on both inner wall and upper wall surfaces of said chamber.

* * * * *